United States Patent [19]

Peach

[11] Patent Number: 5,345,135
[45] Date of Patent: Sep. 6, 1994

[54] INTERDIGITAL TRANSDUCER FOR USE IN A SURFACE ACOUSTIC WAVE FILTER

[75] Inventor: Robert C. Peach, Cambridge, Canada

[73] Assignee: Com Dev Ltd., Cambridge, Canada

[21] Appl. No.: 10,072

[22] Filed: Jan. 26, 1993

[30] Foreign Application Priority Data

May 25, 1992 [CA] Canada ................................. 2069370

[51] Int. Cl.$^5$ ............................................. H01L 41/08
[52] U.S. Cl. ............................... 310/313 B; 310/313 C
[58] Field of Search ........... 310/313 R, 313 B, 313 C; 333/151, 154, 194, 196, 191

[56] References Cited

U.S. PATENT DOCUMENTS

| 4,144,508 | 3/1979 | Lewis et al. | 333/191 |
| 4,322,651 | 3/1982 | Inoue et al. | 310/313 B |
| 4,406,964 | 9/1983 | Chiba et al. | 310/313 B |
| 4,575,653 | 3/1986 | Sinha | 310/313 B |
| 4,999,535 | 3/1991 | Mariani et al. | 310/313 B |

Primary Examiner—Mark O. Budd
Attorney, Agent, or Firm—Daryl W. Schnurr

[57] ABSTRACT

An interdigital transducer for use in a surface acoustic wave filter has two busbars of an irregular shape to reduce the effect of internally reflected surface waves. The busbars will usually have an identical shape to one another and have stepped outer and inner edges. The distance between a portion of the outer edge and a corresponding portion of the inner edge can be constant for a particular busbar or that distance can vary. With previous busbars, the outer and inner edges are linear and each busbar has a rectangular shape.

8 Claims, 4 Drawing Sheets

INTERDIGITAL TRANSDUCER FOR USE IN A SURFACE ACOUSTIC WAVE FILTER

BACKGROUND OF THE INVENTION

1. Field of the Invention

This invention relates to an interdigital transducer for use in a surface acoustic wave (SAW) filter and in particular to transducers having busbars with edges of non-linear shapes.

2. Description of the Prior Art

Transducers formed from a thin film of metal pattern on a piezoelectric substrate are known. The pattern is shaped so that the transducer has two busbars with a plurality of electrodes extending between the busbars. The electrodes are parallel to one another and each electrode has a break. The transducer is connected within the filter so that when voltage is applied across the busbars, electric fields between the electrodes generate surface acoustic waves. The busbars have a rectangular shape. The surface waves experience reflections at any discontinuities, such as features in the patterns or substrate edges. These reflections produce spurious signals which distort the response of the transducer. Substrate edges are usually cut at special angles to reflect waves into harmless directions. An acoustic absorber is used at critical points to attenuate the unwanted waves. However, these techniques are not directly applicable to unwanted reflections occurring within the transducer itself. These reflections can occur at the boundaries between the free surface region, the region under the busbars and the region containing the electrodes. The surface wave propagation velocity is different in each region. Although reflections from the boundaries between propagation regions are very weak, they do produce significant effects, particularly in the stopband region on the high frequency side of a SAW filter passband.

SUMMARY OF THE INVENTION

An interdigital transducer for use in a surface acoustic wave filter has a thin film of metal pattern on a piezoelectric substrate. The pattern is shaped so that the transducer has two busbars with a plurality of electrodes extending between the busbars. The electrodes are parallel to one another. Each electrode has a break, the transducer being connected within the filter so that when voltage is applied across the busbars, electric fields between the electrodes generate surface acoustic waves. Each busbar has an inner edge and an outer edge, the inner edge extending between each of the electrodes. The outer edge has outermost portions and all outermost portions are parallel to said inner edge. The inner and outer edges have a non-linear shape and are shaped relative to one another to reduce the effect of internally reflected surface waves.

DESCRIPTION OF A PREFERRED EMBODIMENT

Figure 1:
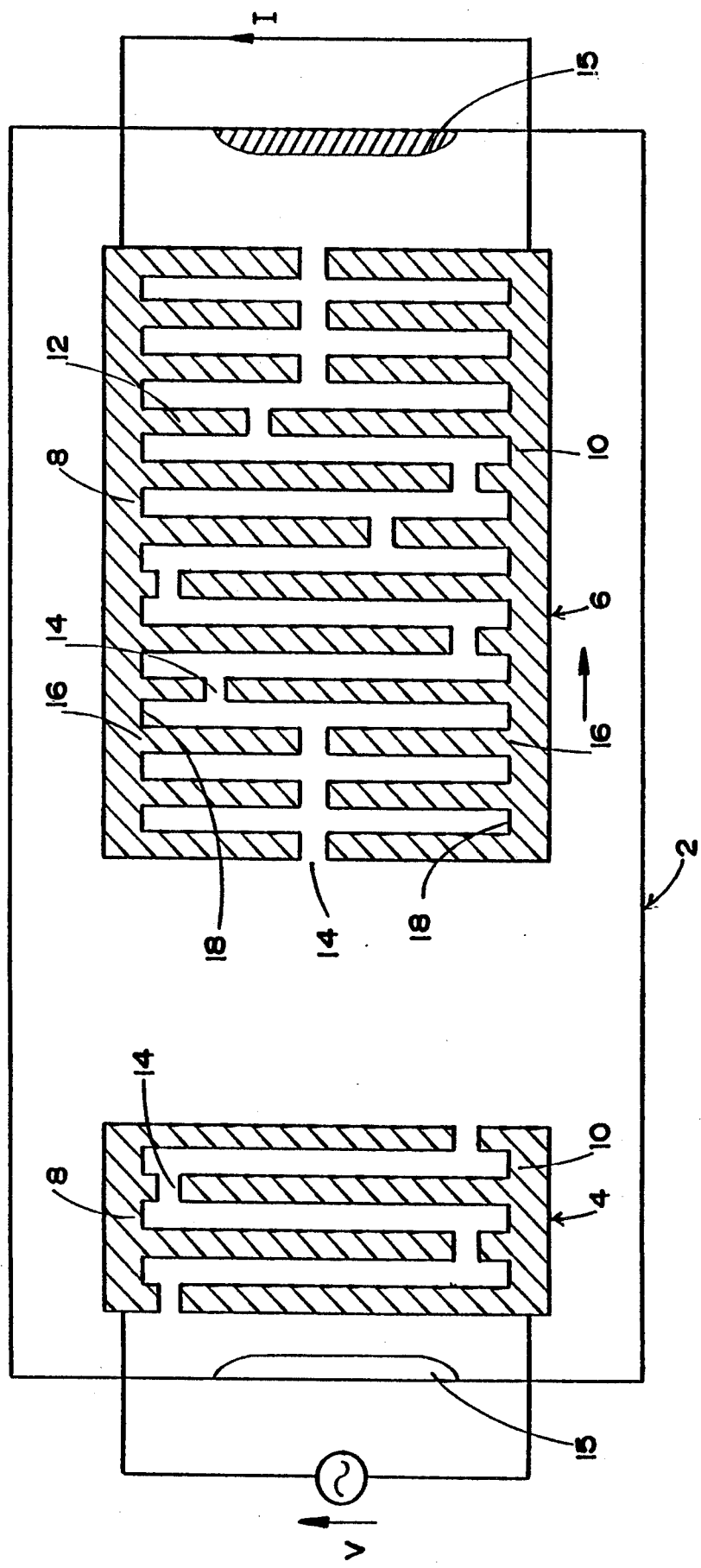
FIG. 1 is a schematic top view of a prior art SAW bandpass filter having an input transducer and an output transducer.

In FIG. 1, there is shown a prior art filter 2 having an input transducer 4 and an output transducer 6. Each transducer 4, 6 has two busbars 8, 10 with electrodes 12 extending therebetween. Each electrode has a break 14. The filter 2 has absorbers 15 at either end. The output transducer 6 has N+1 electrodes where N is an integer equal to or greater than zero.

It can be seen that each busbar 8, 10 has a straight outer edge 16 that is parallel to an inner edge 18. The point at which the electrodes join the busbars are all in a straight line parallel to a central axis of the transducer.

Figure 2:
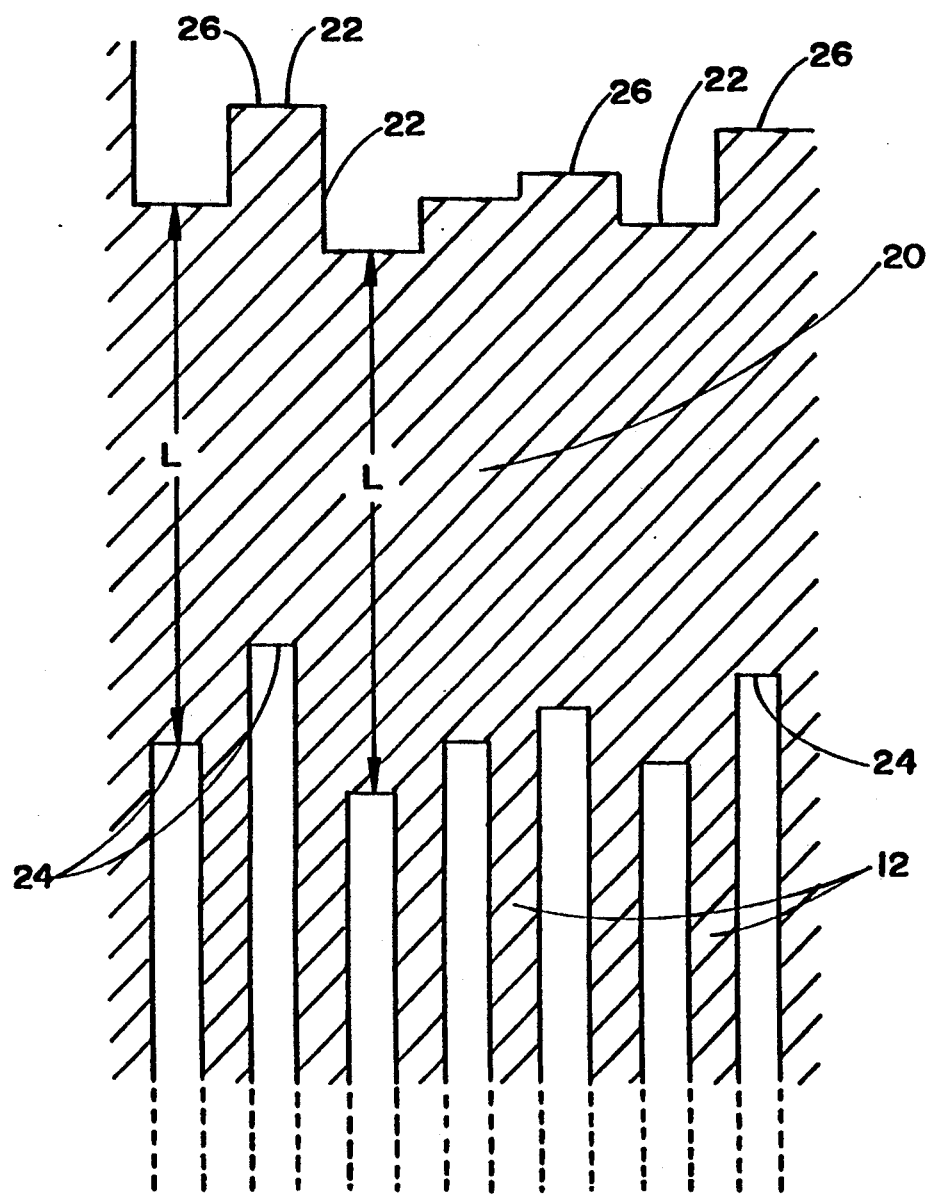
FIG. 2 is a top view of part of a busbar and electrodes of a transducer where the busbar has a non-linear shape.

In FIG. 2, a busbar 20 has an outer edge 22 and an inner edge 24 that each have a non-linear shape. The outer edge 22 has outermost portions 26 and all outermost portions 26 are parallel to the inner edge 24. The outer edge 22 has a random shape and the inner edge is located so that the distance between each outermost portion 26 and the inner edge corresponding to that outermost portion is a constant distance L.

Figure 3:
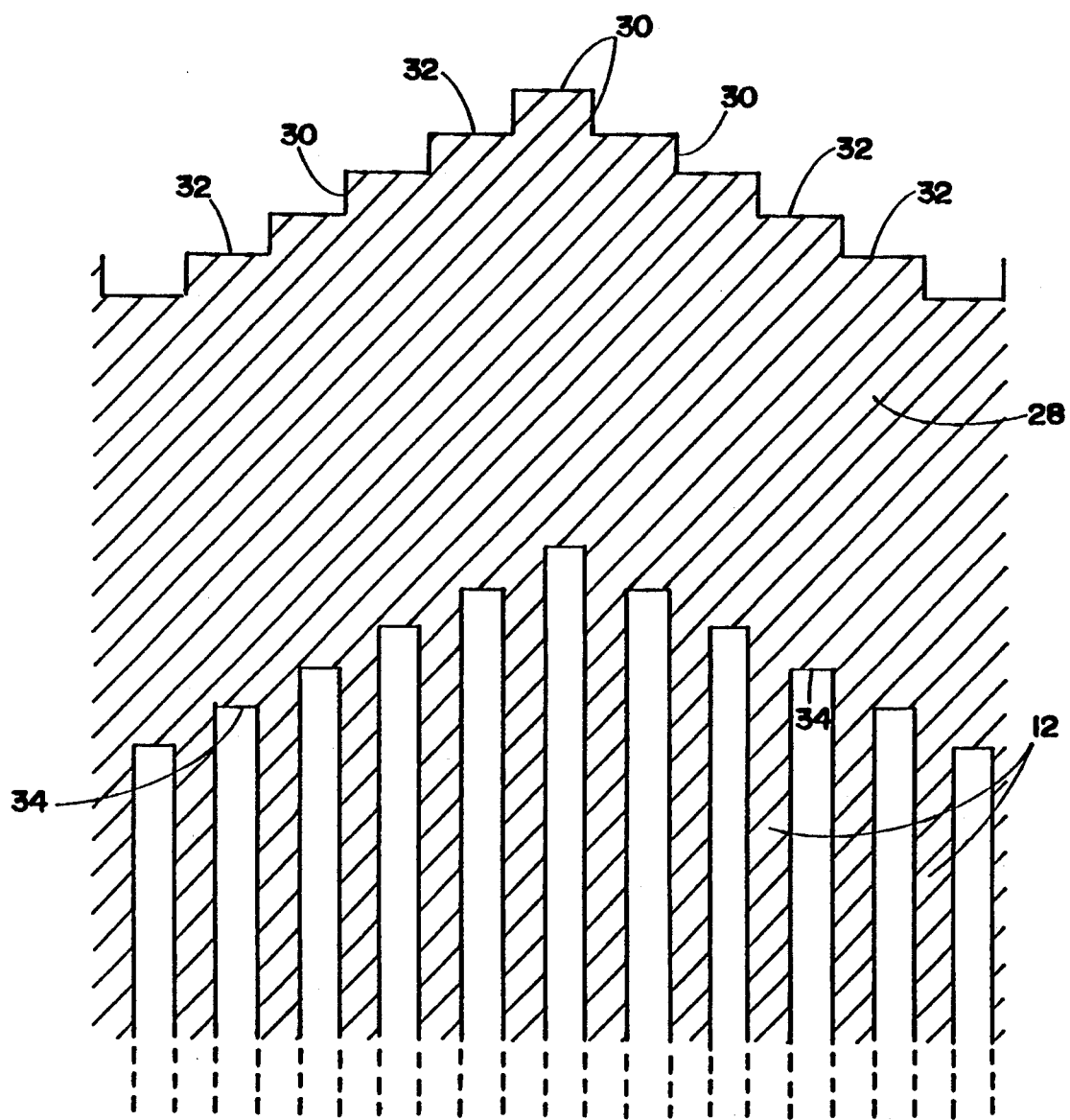
FIG. 3 is a partial top view of a busbar and electrode where the busbar has a sawtooth outer edge.

In FIG. 3, a busbar 28 has an outer edge 30 with outermost portions 32 and an inner edge 34. The outer edge 30 has a sawtooth or stepped configuration that steadily increases and then steadily decreases by a fixed amount. The distance between each outermost portion 32 and that part of the inner edge corresponding to the outermost portion is constant.

Figure 4:
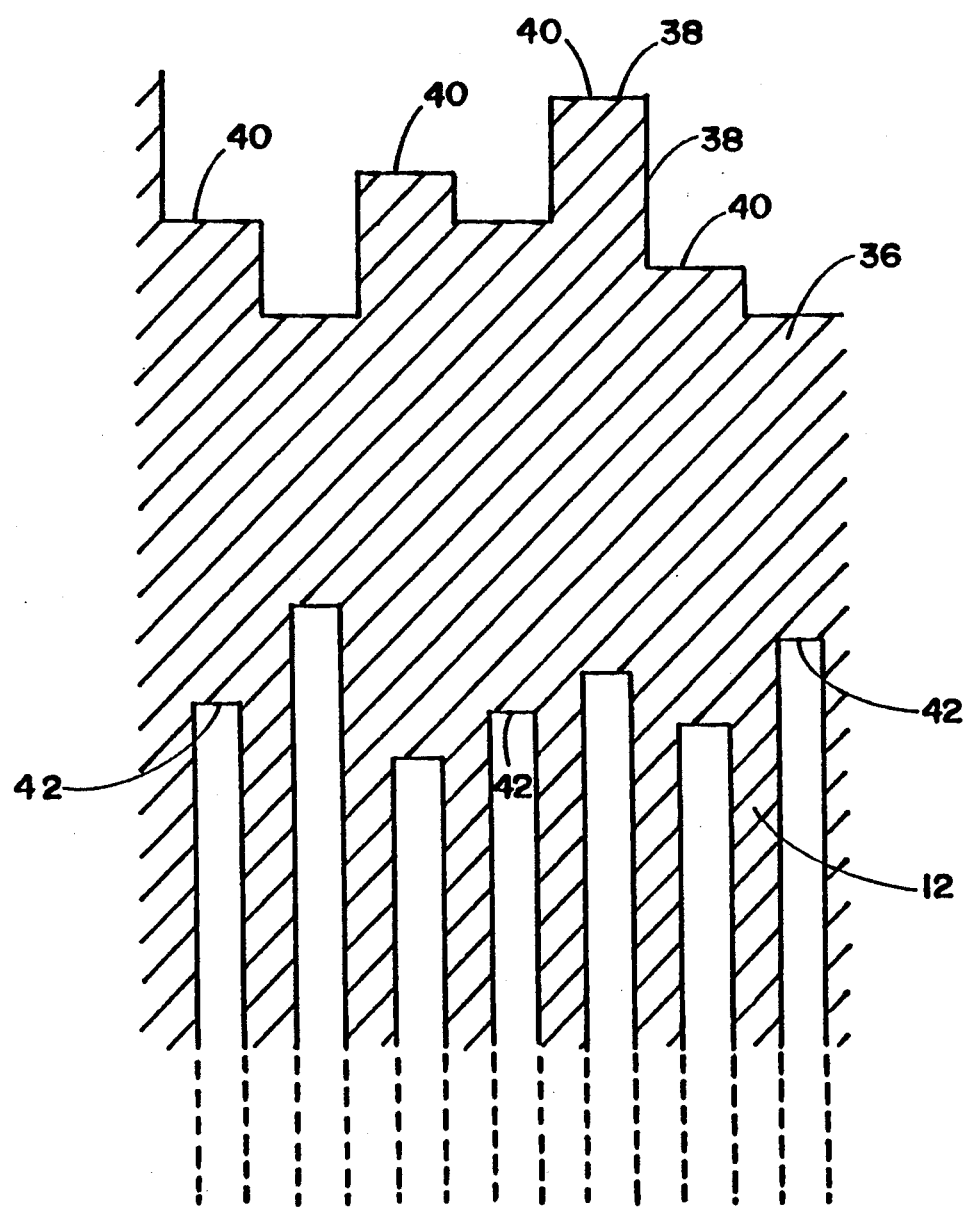
FIG. 4 is a partial top view of a busbar and electrodes where the busbar has a randomly shaped edge.

In FIG. 4, there is shown a busbar 36 having an outer edge 38 and outermost portions 40 with an inner edge 42. The outer and inner edges are randomly shaped and the distance between the outermost portions and a corresponding portion of the inner edge varies.

In each of FIGS. 2, 3 and 4, only one busbar is shown, but the two busbars of the same transducer usually have an identical shape. Also, a transducer will usually have thousands of electrodes and, for ease of illustration, only a relatively small number of these electrodes is shown. A particular pattern of electrodes can be repeated throughout the busbar.

Usually the busbars have an identical shape. With optical pattern generator technology, where the pattern is found by repeated flashes of a reticle, all four busbar edges must move together and it would therefore be extremely inefficient to make the busbars different from one another. However, with E-beam mask technology, for example, the four edges can be given independent shapes, without penalty. While there is no particular advantage of doing this and while it will increase the complexity of data preparation, the performance of the transducer will not be diminished.

The thin film of metal pattern is usually aluminum. The piezoelectric substrate can be made of any suitable material, for example, quartz, lithium niobate or lithium tantalate. A masked pattern is formed using a reticle which would be moved in steps in the 'x' direction to flash out an electrode gap at each step. By moving the reticle in the 'y' direction at each step as well, arbitrary edge profiles can be formed. A second pass with a different reticle is used to define the electrode breaks. To provide independent patterns of all four edges (i.e. an inner and outer edge for each busbar) requires four times as many flashes which would usually be prohibitively costly in machine time. With other coventional mask generation technologies, there is no penalty in specifying independent edge patterns. Edge patterns could be random or sawtooth structures or a combination of random and sawtooth structures. The outer edge profiles shown in the drawings have a rectangular structure. Comparable random or sawtooth structures could be produced from non-rectangular structures, for example, a parallelogram. When a parallelogram is used, the outermost portions of the outer edge will still be parallel to the inner edge but a side edge extending to and from the outermost portion will be at an angle between 0° and 90° relative to the inner edge.

What I claim as my invention is:

1. An interdigital transducer for use in a surface acoustic wave filter, said transducer comprising a thin film of metal pattern on a piezoelectric substrate, said pattern being shaped so that the transducer has two busbars with a plurality of electrodes extending between the busbars, the electrodes being parallel to one another, each electrode having a break, the transducer being connected within the filter so that when voltage is applied across the busbars, electric fields between the electrodes generate surface acoustic waves, each busbar having an inner edge and an outer edge, the inner edge extending between each of the electrodes, said outer edge having outermost portions, all outermost portions being parallel to said inner edge, said inner and outer edges having a non-linear shape in the form of a pattern and being shaped relative to one another to reduce the effect of internally reflected surface waves said pattern being repeated throughout said filter.

2. A transducer as claimed in claim 1 wherein the two busbars have an identical shape.

3. A transducer as claimed in claim 1 wherein the number of electrodes is equal to N+1 where N is an integer greater than zero.

4. A transducer as claimed in claim 1 wherein the outer and inner edges have a random shape throughout the length of each busbar so that the distance between the outermost portion and the inner edge is constant.

5. A transducer as claimed in claim 4 wherein the busbars have a random pattern that is repeated throughout the length.

6. A transducer as claimed in claim 1 wherein the outer edge is formed in a stepped configuration that steadily increases in one direction and then steadily decreases in an opposite direction by a fixed amount to form a pattern, said pattern being repeated throughout the length of the transducer with the inner edge being shaped so that the distance between the outermost portion of the outer edge and the corresponding portion of the inner edge remains constant.

7. A transducer as claimed in any one of claims 1, 2 or 3 wherein the substrate is selected from the group of quartz, lithium niobate or lithium tantalate and the metal pattern is formed of aluminum.

8. A transducer as claimed in claim 1 wherein the busbars are shaped so that the distance between the outermost portion of the outer edge and the inner edge varies.

* * * * *